United States Patent [19]
Genzel

[11] Patent Number: 5,481,210
[45] Date of Patent: Jan. 2, 1996

[54] METHOD FOR CONTROLLING CLOCK FREQUENCY OF A DIGITAL LOGIC SEMICONDUCTOR ACCORDING TO TEMPERATURE

[75] Inventor: Michael Genzel, Rosstal, Germany

[73] Assignee: Temic Telefunken Microelectronic GmbH, Heilbronn, Germany

[21] Appl. No.: 338,747

[22] Filed: Nov. 9, 1994

[30] Foreign Application Priority Data

Nov. 26, 1993 [DE] Germany .................. 43 40 284.4

[51] Int. Cl.$^6$ .................. H03K 7/00; H03K 19/00
[52] U.S. Cl. .................. 326/93; 326/32; 326/9; 326/101
[58] Field of Search .................. 326/9, 32, 93, 326/101

[56] References Cited

U.S. PATENT DOCUMENTS

| | | | |
|---|---|---|---|
| 3,725,789 | 4/1973 | Mager | 326/93 |
| 3,835,458 | 9/1974 | Mrazek | 326/32 |
| 3,938,316 | 2/1976 | Morokawa et al. | 326/32 |
| 4,710,648 | 12/1987 | Hanamura et al. | 326/32 |

FOREIGN PATENT DOCUMENTS

| | | |
|---|---|---|
| 60-43852 | 3/1985 | Japan . |
| 4-4605 | 1/1992 | Japan . |
| 4307964 | 10/1992 | Japan . |
| 5-14175 | 1/1993 | Japan . |

*Primary Examiner*—Edward P. Westin
*Assistant Examiner*—Richard Roseen
*Attorney, Agent, or Firm*—Spencer, Frank & Schneider

[57] ABSTRACT

A method for operating a digital logic semiconductor component, wherein: the logic semiconductor component is operated in several operational modes at respective fixed clock cycles depending on environmental temperatures; each operational mode is allocated a respective clock cycle with, in each case, a different clock frequency; each operational mode is allocated a respective temperature-dependent limit value with, in each case, a different limit temperature which when reached causes a change of operational mode to occur; and, when changing to an operational mode with a higher limit temperature, the clock frequency is reduced, and when changing to an operational mode with a lower limit temperature, the clock frequency is increased.

11 Claims, 1 Drawing Sheet

METHOD FOR CONTROLLING CLOCK FREQUENCY OF A DIGITAL LOGIC SEMICONDUCTOR ACCORDING TO TEMPERATURE

BACKGROUND OF THE INVENTION

Digital logic semiconductor components (microcontrollers, for example) are used in many different applications—for instance, to control peripheral devices. These logic semiconductor components—frequently operated in cyclic mode—will usually need to meet very special requirements, depending on their relevant operating environment. In particular, temperature plays an important part here, as specific components will be selected, inter alia, according to their maximum permissible environmental temperature as specified by the customer; therefore, in applications where high temperature requirements are specified, or where environmental temperature conditions vary greatly—as is the case, e.g., in motor vehicle engineering applications—, specially optimized and costly components must be used for such applications.

However, high environmental temperatures usually occur only under extreme environmental conditions, and then only for a very brief period during the entire working life of the devices controlled by such logic semiconductor components; that is, the use of "high temperature" components cannot be justified from an economic and cost-effectiveness point of view.

SUMMARY OF THE INVENTION

The object of the invention is a method which enables the temperature range for the use of conventional logic semiconductor components to be significantly extended.

The above object is achieved according to the present invention by a method for operating a digital logic semiconductor component, wherein: a logic semiconductor component which may be operated in several operational modes M at fixed clock cycles depending on environmental temperature ($T_U$), and with each operational mode (M) being allocated a clock cycle (TA) with a different clock frequency (f), is provided; each operational mode (M) is allocated a temperature dependent limit value and for each value a respective different limit temperature ($T_G$), which when reached causes a change in the operational mode (M); and the clock frequency (f) is reduced when changing to an operational mode (M) with an increased limit temperature ($T_G$), and increased when changing to an operational mode (M) with a lower limit temperature ($T_G$). Further advantageous applications and features of this method are likewise disclosed.

The method presented here will define several different operational modes M for a digital logic semiconductor component: each operational mode M will be allocated a processor clock cycle TA with a specific clock frequency f and a limit temperature $T_G$; when this temperature $T_G$ is reached, the operational mode M will change. In operational modes M with a higher limit temperature $T_G$—or, which is the same, with a higher permissible environmental temperature $T_U$—, the functional range of the computing program or software will be reduced; as this reduction of the functional range will lead to shorter program run times, clock frequency f in operational modes with higher permissible environmental temperatures $T_U$ can be reduced—to such an extent, in particular, that program run times will return to their original values. Limit temperatures $T_G$ for the operational modes M will be determined by the relevant specified or preselected clock frequency f, as the permissible environmental temperature $T_U$ for the logic semiconductor component, and thus also the limit temperature $T_G$, for each operational mode M will be dependent on power dissipation $P_V$; this again will be dependent on clock frequency f. For a linear relationship between power dissipation $P_V$ and clock frequency f, the following will apply:

$$P_V = a + b \cdot f \quad (1),$$

where a and b will be constants dependent on the manufacturing process of this semiconductor component.

For a given thermal contact resistance $R_{th}$ and a given maximum junction temperature $T_S$ of the logic semiconductor component, a relationship between maximum permissible environmental temperature $T_U$ and power dissipation $P_V$ can be stated as follows:

$$T_U = T_S - P_V \cdot R_{th} \quad (2).$$

Equation (1) thus yields a linear relationship between maximum permissible environmental temperature $T_U$ and clock frequency f:

$$T_U = T_S - a \cdot R_{th} - b \cdot R_{th} \cdot f = \text{constant} - b \cdot R_{th} \cdot f \quad (3).$$

For limit temperature $T(T_G \leq T_U)$, this will yield the relation:

$$T_G \leq \text{constant} - b \cdot R_{th} \cdot f \quad (4).$$

Equations (1) to (3) show that reducing clock frequency f will lead to a significant reduction of power dissipation $P_V$ and thus a significantly higher permissible environmental temperature $T_U$ for the logic component. For a given clock frequency f, limit temperature $T_G$ may be selected within the range determined by equation (4); for a given permissible environmental temperature $T_U$, this limit temperature $T_G$ will preferably be selected as the maximum possible temperature ($T_G = T_U$).

Reducing the clock frequency, and thus the power dissipation, will increase the maximum permissible environmental temperature for logic semiconductor components; even for high temperature requirements, therefore, cost-effective conventional logic semiconductor components may be used. No specialist specifications will be required. Furthermore, reducing power dissipation for a given environmental temperature enables the junction temperature to be decreased and thus a significant increase in the life of these logic semiconductor components.

DESCRIPTION OF THE DRAWINGS

The method presented here will hereinafter be further explained using the enclosed drawing.

DESCRIPTION OF A PREFERRED EMBODIMENT

Figure 1:
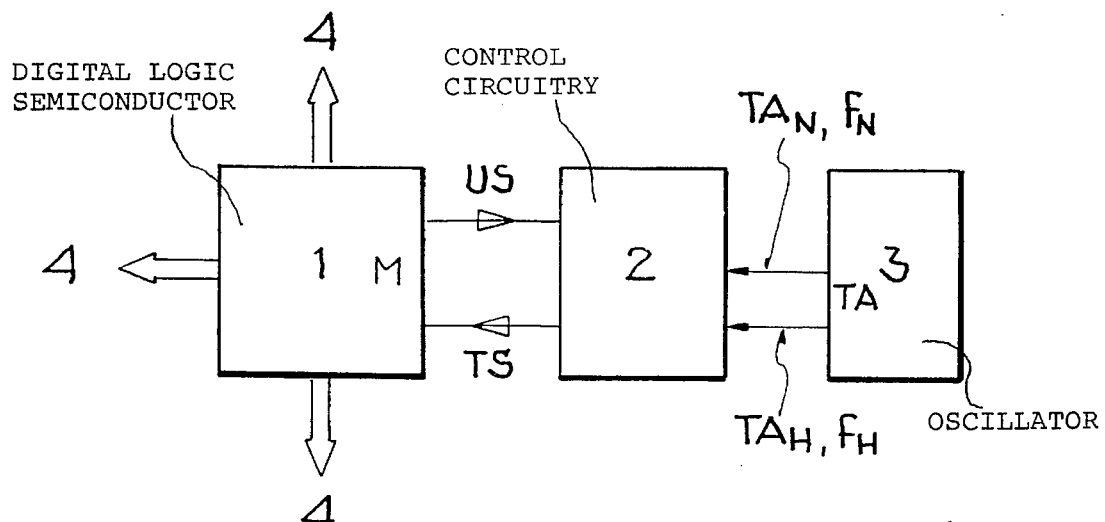
FIG. 1 shows a block diagram containing all components necessary for operating the logic semiconductor component.

As shown in FIG. 1, oscillator 3 which generates processor clock cycle TA will apply clock signal TS via circuitry 2 to the digital logic semiconductor component 1 controlling devices 4. The logic semiconductor component 1 may be operated in two operational modes M: a normal mode $M_N$ with full functional range and normal (operational) clock frequency $f_N$, and a high temperature mode $M_H$ with reduced functional range and reduced clock frequency $f_H$.

Figure 2:
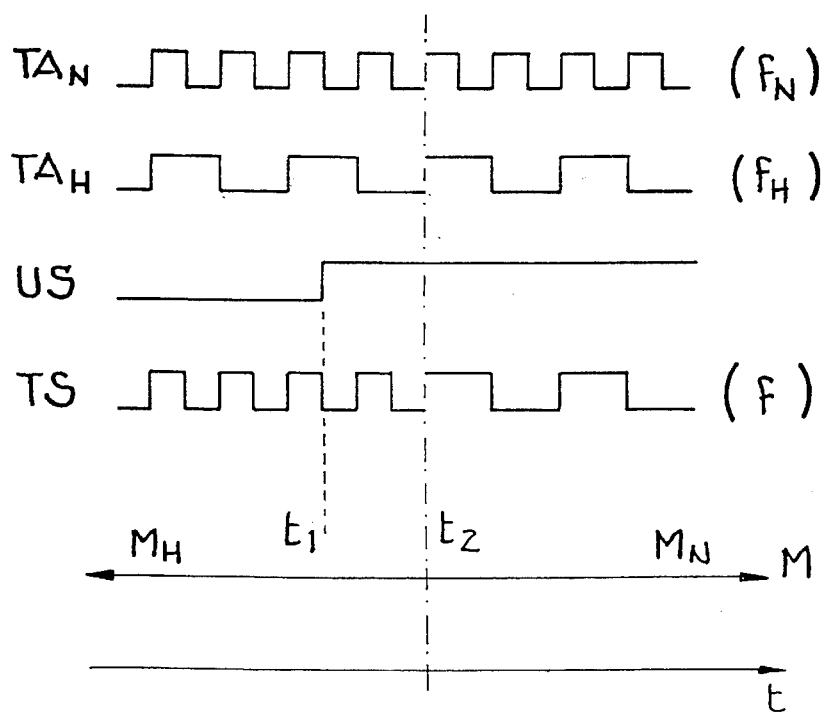
FIG. 2 shows a timing diagram to illustrate mode switching.

When the limit temperature is reached, switching signal US generated by the logic semiconductor component 1 will cause oscillator 3—by means of circuitry 2—to switch over from clock cycle $TA_N$ with the higher "normal" clock frequency $f_N$ (normal operation) to clock cycle $TA_H$ with reduced "high temperature" clock frequency $f_H$ (high temperature operation). Circuitry 2 will coordinate ramp synchronous switching over between clock cycle $TA_N$ and clock cycle $TA_H$: according to FIG. 2, switching signal US given at time $t_1$ will only have an effect on clock cycle TA at time $t_2$, as both clock cycles $TA_N$ and $TA_H$ will be ramp synchronous at this point. In an example embodiment—a microprocessor-controlled gear transmission system in a motor vehicle—, and for a maximum permissible environmental temperature of 150° C., the following will apply: when a limit temperature $T_G$ of 125° C. is exceeded, switch-over from normal mode $M_N$ with a clock frequency $f_N$=40 MHZ to high temperature mode $M_H$ with a clock frequency $f_H$=20 MHZ will occur.

What is claimed is:

1. Method for operating a digital logic semiconductor component, where:

(a) depending on environmental temperature ($T_U$), logic semiconductor component (1) may be operated in several operational modes M at respective fixed clock cycles, (b) each operational mode (M) is allocated a respective clock cycle (TA) with a different clock frequency (f), (c) each operational mode (M) is allocated a temperature dependent limit value and for each value a respective different limit temperature ($T_G$), which when reached causes a change in the operational mode (M), and (d) the clock frequency (f) is reduced when changing to an operational mode (M) with increased limit temperature ($T_G$), and increased when changing to an operational mode (M) with lower limit temperature ($T_G$).

2. Method in accordance with claim 1, wherein the clock cycles (TA) of the operational modes (M) are generated by an oscillator (3) which applies a clock signal (TS) of the relevant clock frequency (f) to the logic semiconductor component (1).

3. Method in accordance with claim 1, wherein the logic semiconductor component (1) initiates a change of operational mode (M) by means of a switching signal (US), and wherein this switching signal (US) is applied to a circuit link (2) which is bidirectionally connected to the logic semiconductor component (1) and the oscillator (3).

4. Method in accordance with claim 3, wherein, on change of operational mode (M), circuit link (2) effects a ramp synchronous switchover of clock frequency.

5. Method in accordance with claim 1, wherein the limit temperature ($T_G$) of an operational mode (M) will be selected in relation to the relevant clock frequency (f) of this operational mode (M).

6. Method in accordance with claim 5, wherein the limit temperature ($T_G$) is selected to be the same as the maximum permissible environmental temperature ($T_U$) for the relevant clock frequency (f) of the operational mode (M).

7. Method in accordance with claim 1, wherein the logic semiconductor component (1) is operated in two different operational modes (M) with different clock frequencies (f).

8. Method in accordance with claim 7, wherein these two operational modes (M) are defined as a normal mode ($M_N$) and a high temperature mode ($M_H$), and wherein changeover from the normal mode ($M_N$) with the higher clock frequency ($f_N$) to the high temperature mode ($M_H$) with the lower clock frequency ($f_H$) occurs at a limit temperature ($T_G$) depending on the clock frequency ($f_N$) of the normal mode ($M_N$).

9. Method in accordance with claim 1, wherein used for operating a microcontroller (1) used for controlling devices (4) in motor vehicle applications.

10. Method in accordance with claim 2, wherein the logic semiconductor component (1) initiates a change of operational mode (M) by means of a switching signal (US), and wherein this switching signal (US) is applied to a circuit link (2) which is bidirectionally connected to the logic semiconductor component (1) and the oscillator (3).

11. Method in accordance with claim 10, wherein, on change of operational mode (M), circuit link (2) effects a ramp synchronous switchover of the clock frequency.

* * * * *